(12) United States Patent
Daudin et al.

(10) Patent No.: US 11,189,752 B2
(45) Date of Patent: Nov. 30, 2021

(54) NANOWIRE STRUCTURE AND METHOD FOR PRODUCING SUCH A STRUCTURE

(71) Applicant: COMMISSARIAT A L'ENERGIE ATOMIQUE ET AUX ENERGIES ALTERNATIVES, Paris (FR)

(72) Inventors: Bruno Daudin, La Tronche (FR); Marc Delaunay, Meylan (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/495,579

(22) PCT Filed: Mar. 19, 2018

(86) PCT No.: PCT/EP2018/056881
§ 371 (c)(1),
(2) Date: Sep. 19, 2019

(87) PCT Pub. No.: WO2018/172281
PCT Pub. Date: Sep. 27, 2018

(65) Prior Publication Data
US 2020/0028027 A1    Jan. 23, 2020

(30) Foreign Application Priority Data
Mar. 20, 2017    (FR) ...................... 1752286

(51) Int. Cl.
*H01L 33/08* (2010.01)
*H01L 33/34* (2010.01)
(Continued)

(52) U.S. Cl.
CPC .......... *H01L 33/08* (2013.01); *H01L 33/0093* (2020.05); *H01L 33/34* (2013.01); *H01L 33/42* (2013.01)

(58) Field of Classification Search
None
See application file for complete search history.

(56) References Cited

U.S. PATENT DOCUMENTS 8,791,480 B2    7/2014    Song
9,331,233 B2    5/2016    Dussaigne et al.
(Continued)

FOREIGN PATENT DOCUMENTS

EP    2 259 344 A2    12/2010
FR    2 984 599 A1    6/2013
(Continued)

OTHER PUBLICATIONS

Definition of place downloaded from URL<https://www.merriam-webster.com/dictionary/place> on Sep. 23, 2020 (Year: 2020).*
(Continued)

*Primary Examiner* — J. E. Schoenholtz
(74) *Attorney, Agent, or Firm* — Westerman, Hattori, Daniels and Adrian, LLP

(57) ABSTRACT

A process for producing a structure (100) comprising a membrane (3) of a first material, in particular indium-tin oxide, in contact with receiving ends (13) of a plurality of nanowires (1), the process comprising forming a nanowire device (10) comprising the receiving ends (13), the receiving ends being formed so as to form planar surfaces, and (ii) placing, especially by transfer, a membrane device (3; 34) directly on the nanowires the planar surfaces of the ends for receiving the membrane.

21 Claims, 4 Drawing Sheets

(51) Int. Cl.
*H01L 33/42* (2010.01)
*H01L 33/00* (2010.01)

(56) References Cited

U.S. PATENT DOCUMENTS

| | | | | |
|---|---|---|---|---|
| 2007/0248132 | A1* | 10/2007 | Kikuchi | H01S 5/021 |
| | | | | 372/44.01 |
| 2011/0062467 | A1 | 3/2011 | Song | |
| 2011/0147786 | A1 | 6/2011 | Song | |
| 2013/0001511 | A1* | 1/2013 | Pedersen | H01L 33/24 |
| | | | | 257/13 |
| 2013/0256689 | A1 | 10/2013 | Pougeoise et al. | |
| 2014/0175372 | A1* | 6/2014 | berg | H01L 31/1852 |
| | | | | 257/9 |
| 2014/0295179 | A1* | 10/2014 | Naito | H01L 29/413 |
| | | | | 428/339 |
| 2014/0327037 | A1 | 11/2014 | Dussaigne et al. | |
| 2016/0365480 | A1* | 12/2016 | Mi | H01L 33/007 |
| 2017/0253532 | A1* | 9/2017 | Wang | C01B 32/182 |
| 2018/0204977 | A1 | 7/2018 | Dheeraj et al. | |
| 2018/0261455 | A1* | 9/2018 | Ooi | H01L 21/02631 |
| 2018/0351037 | A1* | 12/2018 | Zhang | H01L 33/0075 |
| 2020/0259047 | A1* | 8/2020 | Ooi | H01L 33/007 |

FOREIGN PATENT DOCUMENTS

| | | |
|---|---|---|
| FR | 2 988 904 A1 | 10/2013 |
| KR | 10-1338148 B1 | 1/2014 |
| WO | 2017/009394 A1 | 1/2017 |

OTHER PUBLICATIONS

Definition of transfer downloaded from URL<https://www.merriam-webster.com/dictionary/transfer> on Sep. 23, 2020. (Year: 2020).*
International Search Report and Written Opinion dated Apr. 17, 2018 issued in corresponding application No. PCT/EP2018/056881; w/ English partial translation and partial machine translation (25 pages).

* cited by examiner

NANOWIRE STRUCTURE AND METHOD FOR PRODUCING SUCH A STRUCTURE

The invention relates to a process for producing a nanowire structure. The invention further relates to a structure obtained by implementing the production process.

The invention in particular relates to the field of light-emitting diodes (LEDs). These diodes may emit in an emission range extending from the visible to the ultraviolet. More precisely, the invention relates to the family of nanowire LEDs but may also be applied to other nanostructure devices. Generally, the invention relates to any LED or any device consisting of one, a few or a set of non-coalesced three-dimensional nanostructures deposited on or etched in a substrate.

In this field, there is a problem with production of an electrical contact on the nanostructures. Specifically, it is necessary to produce electrical contacts between an electrode and the tops of the nanostructures. It is therefore necessary to ensure an electrical contact with a large number of nanostructures (typically $10^8$ to $10^{10}$ contacts per $cm^2$) while ensuring the uniform passage of current and while avoiding any short-circuit between the tops and bottoms of the nanostructures.

It has been imagined to produce these electrical contacts by depositing, on the tops of the nanostructures, a barrier layer sufficient to prevent a metal layer subsequently deposited on the barrier layer from causing short-circuits. The barrier layer must moreover be sufficiently thin or conductive to allow the passage of electrical current. To this end, it has been envisioned to use graphene to produce the barrier layer. Thus, a graphene monolayer is first deposited on the tops of the nanostructures before an additional layer is subsequently deposited on the barrier layer in order to form an electrode.

However, problems remain: firstly, the electrical conduction of graphene cannot be taken for granted, and the graphene layer must be very thin if the current is to be able to pass by tunneling. Secondly, in the case of a very thin graphene layer, the mechanical strength of the layer is problematic, above all if it is desired for the layer to extend over a large area.

The aim of the invention is to remedy the aforementioned drawbacks and to improve processes for producing nanowire structures that must be electrically connected. In particular, the invention proposes a process allowing structures comprising electrically connected nanowires to be reliably produced.

According to the invention, the process for producing a structure comprising a membrane of a first material, in particular indium-tin oxide, in contact with receiving ends of a plurality of nanowires, comprises the following steps:

Forming a nanowire device comprising the receiving ends, the receiving ends being formed so as to form planar surfaces, Placing, especially by transfer, a membrane device directly on the nanowires at the planar surfaces of the ends for receiving the membrane.

The process may comprise a step of depositing a layer of an electrically conductive second material on the membrane, especially a step of depositing a layer of a second material identical to the first material.

The membrane may be transparent and electrically conductive and/or the membrane may be intended to form an electrode and/or the nanowires may be light-emitting-diode structures.

The process may comprise a step of producing the membrane device, comprising the following steps:
Providing a second substrate, especially a silicon wafer,
Depositing, on the second substrate, a sacrificial layer, especially a metal sacrificial layer and in particular a nickel or copper sacrificial layer,
Depositing, on the sacrificial layer, a layer of first material, especially a layer of about 30 nm thickness,
Depositing, on the layer of first material, a resist layer,
Chemically attacking the sacrificial layer, for example with an $FeCl_3$ solution.

Following the step of placing the membrane device on the nanowires at the receiving ends, the structure may be rinsed with a solvent, especially so as to dissolve a layer of the membrane device, in particular so as to dissolve a resist layer of the membrane device.

The step of forming the nanowire device may be implemented by molecular beam epitaxy or by metalorganic vapor-phase epitaxy or by etching.

The forming step may comprise forming the device so that it comprises a first substrate, the nanowires being placed on the first substrate, the nanowires especially being placed perpendicular or substantially perpendicular on a surface of the first substrate, and/or so that the nanowires are prismatic or substantially prismatic and/or so that the nanowires have light-emitting-diode structures.

The forming step may comprise forming the receiving ends so that they form a planar or substantially planar discontinuous surface.

The forming step may comprise forming the device so that the ratio of the sum of the areas of the surfaces of the receiving ends to the continuous area of the surface of a membrane intended to make contact with the receiving ends is higher than 80% or higher than 90% or higher than 95%.

The forming step may comprise forming nanowires so that the nanowires have a geometry that increases in size or flares out in the direction of the receiving ends and/or the forming step may comprise forming nanowires so that the nanowires form micro-pillars or nano-pillars including receiving ends the surfaces of which have dimensions larger than those of the diameters of the nanowires away from the receiving end.

The forming step may comprise forming nanowires so that they each comprise a body and a head, the head having a receiving end, the surface of the receiving end having an area 20% larger, or even 50% larger, than the area of a cross section of the body of a nanowire, especially than the area of a cross section of the nanowire measured parallel to the receiving end at at least 2 µm distance from the receiving end or than the area of a cross section of the nanowire measured parallel to the receiving end in the middle of the nanowire.

The forming step may comprise forming the bodies of the nanowires into stacks of a layer of n-type GaN, of a layer of InGa and of a blocking layer.

The forming step may comprise forming the heads of the nanowires into stacks of a layer of p-type GaN and of a layer of $p^{++}$-type GaN.

The forming step may comprise forming the nanowires from silicon-based material.

According to the invention, a structure, especially a nanowire light-emitting-diode structure, is obtained by implementing the production process defined above.

Objects, characteristics and advantages of the present invention are described in detail in the following description of one embodiment of a device and one implementation of a process for producing a structure. This embodiment and implementation are nonlimiting. The appended drawing contains the following figures.

Figure 1:
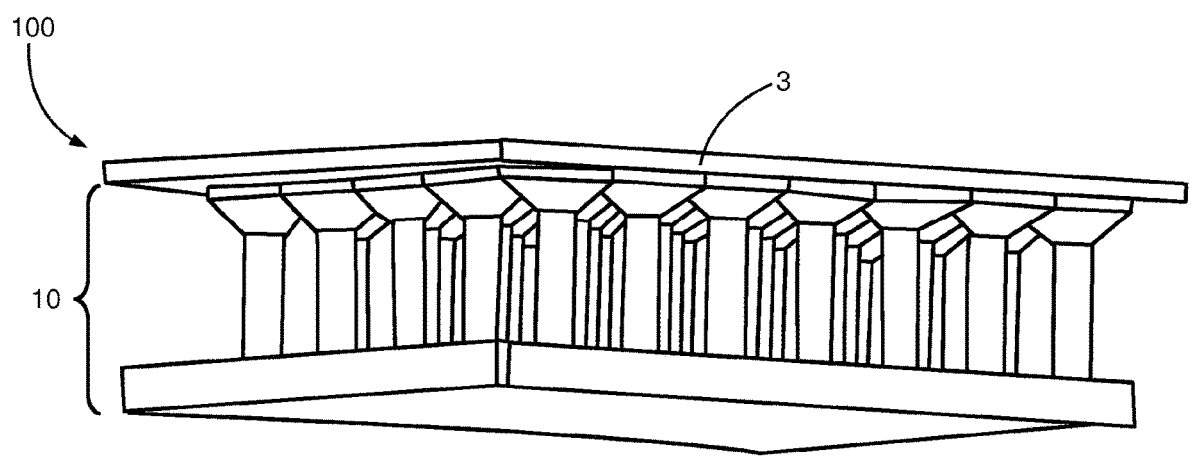
FIG. 1 is a perspective view of one embodiment of a structure comprising nanowires.

One embodiment of a nanowire light-emitting diode 100 is described below with reference to FIG. 1.

The diode comprises a nanowire structure. The structure comprises a nanowire device 10 and a membrane 3 made of a first material, especially indium-tin oxide.

Advantageously, the nanowires have light-emitting-diode structures. The membrane covers the nanowire device. The membrane in particular covers ends of the nanowires called ends for receiving the membrane or receiving ends. The nanowires are not coalesced. The receiving ends form a discontinuous surface.

By "discontinuous surface" what is for example meant is that the receiving ends do not touch. In particular, what is meant is that at least certain receiving surfaces are placed at distance from other neighboring receiving surfaces. Preferably, what is meant is that each receiving surface is placed at distance from other neighboring receiving surfaces.

Figure 9:
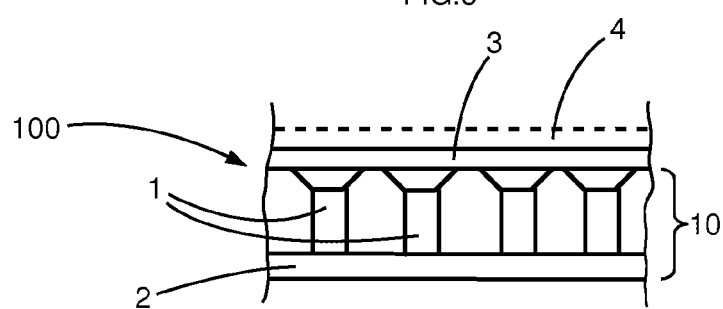

Optionally, the structure 100 may comprise a layer 4 of an electrically conductive second material, especially a second material identical to the first material. This layer then covers the membrane 3 as shown in FIG. 9.

Preferably, the membrane is electrically conductive. Specifically, it is intended to serve as an electrode for injecting current into the nanowires or as an electrode for applying a potential to the nanowires. In the case of a light-emitting-diode structure, the membrane is advantageously transparent.

The transferred membrane must be thin enough and/or supple enough to correctly follow the shape of the surfaces of the receiving ends of the nanowires.

The device 10 comprises at least one nanowire. Preferably, the device 10 comprises a plurality of nanowires. These nanowires are for example arranged in a pattern, each at distance from the others. The nanowires are not coalesced. The receiving ends form a discontinuous surface. For example, the nanowires are placed on a substrate 2 in a plurality of successive rows.

The nanowires may be placed one behind the other in rows. Thus, lines of nanowires are oriented perpendicular to the rows of nanowires. Alternatively, the nanowires may be arranged staggered, each nanowire of a following row being placed between two nanowires of a preceding row. Also alternatively, the nanowires may also be placed more randomly.

Advantageously, the nanowires have a geometry that increases in size or flares out in the direction of the receiving ends. Also preferably, the nanowires form micro-pillars or nano-pillars including receiving ends the surfaces of which have dimensions larger than those of the diameters of the nanowires at distance from the receiving end.

Figure 2:
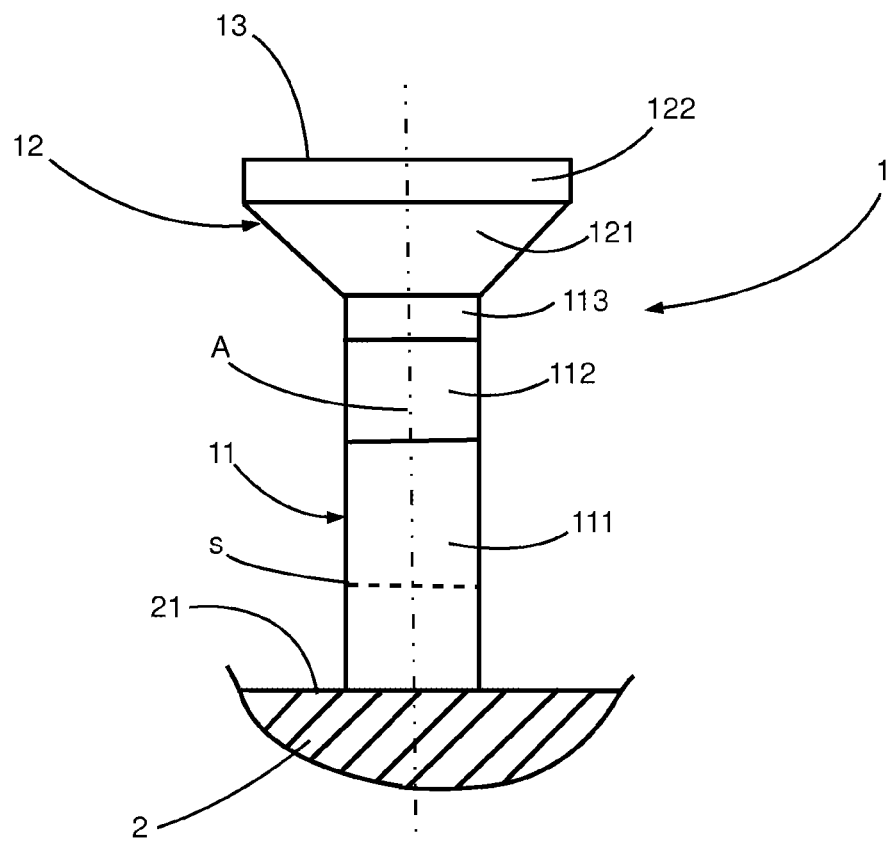
FIG. 2 is a schematic view of a first variant embodiment of a nanowire.
Figure 3:
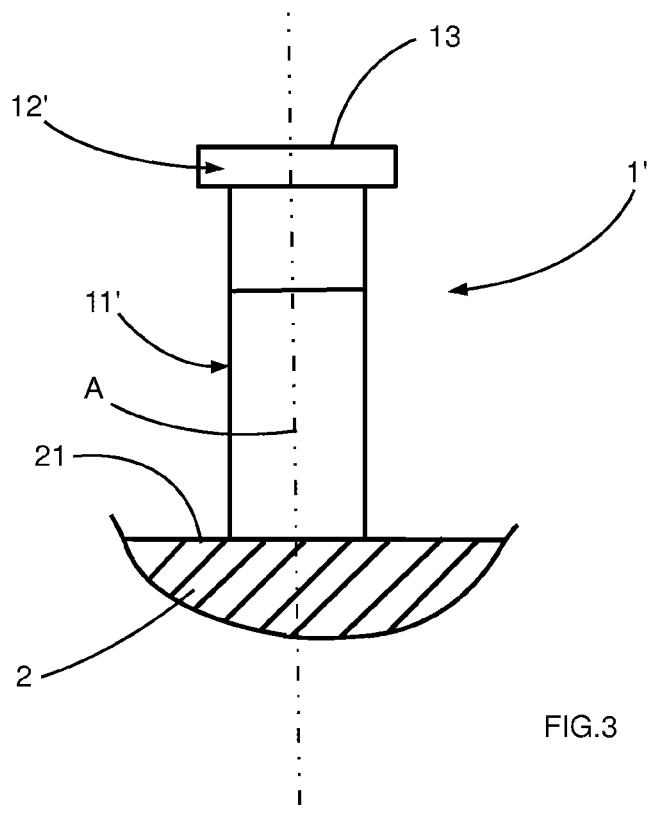
FIG. 3 is a schematic view of a second variant embodiment of a nanowire.

As illustrated in FIGS. 2 and 3, at least one nanowire, and preferably certain nanowires, and more preferably all the nanowires, each comprise a body 11; 11' and a head 12; 12'. By "nanowire" what we preferably mean, throughout this document, is any structure mainly extending in a direction A or along a curve and having a dimension transverse to this direction or to this curve of the order of one micrometer or smaller than one micrometer. Also preferably, all the dimensions of the structure measured transverse to the direction A or to the curve are of the order of one micrometer or smaller than one micrometer.

Preferably, the nanowires are placed perpendicular or substantially perpendicular on a surface 21 of the substrate 2. Thus, a direction A or a curve in or along which the nanowires extend at the surface 21 is perpendicular or substantially perpendicular to this surface 21.

The surface 21 is a planar surface. Alternatively, the surface may be a non-planar ruled surface, or even a warped surface.

The nanowires are preferably prismatic or substantially prismatic, and in particular take the form of right prisms. For example, the nanowires may be of hexagonal cross section. However, the nanowires may have a cross section of any other shape.

Preferably, all the nanowires are similar or identical.

The bodies join the surface 21 of the substrate 2 to the nanowire heads.

In the shown variant of the first embodiment of the light-emitting-diode structure, the nanowires have an axial-type heterostructure such as shown in FIG. 2. In this variant, the body comprises a stack of a layer 111 of n-type GaN, of a layer 112 of InGa and of a blocking layer 113. The layer 111 makes contact with the surface 21 of the substrate. The layer 112 makes contact with the layer 111. The layer 113 makes contact with the layer 112 and with the head.

The heads make contact with the bodies, and especially make contact with the ends of the bodies that do not make contact with the surface 21.

The ends of the heads opposite the ends making contact with the bodies have receiving ends 13. These receiving ends form free surfaces at the end of the phase of forming the nanowires. These receiving ends are intended to receive the membrane 3 in a subsequent step of producing the structure 100.

Preferably, the surfaces of the receiving ends are planar or substantially planar. They may however have a certain concave or convex curvature. For example, the surface of a receiving end of a nanowire is considered to be planar if its minimum radius of curvature is equal to or larger than the height of the body of the nanowire.

The surfaces of the receiving ends have an area substantially larger than the area of a cross section s of the body of the nanowire, for example at least 20% larger, or even at least 50% larger. The cross section s in question of the body of the nanowire is especially positioned parallel to the receiving end or perpendicular to the axis A. In addition, preferably, the cross section s in question is positioned at at least 2 µm distance from the receiving end. For example, the cross section s in question of the nanowire is parallel to the receiving end at the middle of the nanowire or at the middle of the body of the nanowire. Thus, the area of the nanowires making contact with the membrane is significantly larger than the projected area of the base of the nanowires (perpendicular to the direction A in which the nanowires extend). For example, the area of the nanowires making contact with the membrane may be larger than 10 times the projected area of the base of the nanowires.

Preferably, a variation in at least one dimension measured transversely to the direction A in which the nanowire extends allows the head to be discriminated from the body. In this case, the limit between the body and the head may for example be defined by a significant increase in a transverse dimension of the body, and especially an increase of more than 10%. More generally, the head has at least one transverse dimension larger than a transverse dimension of the body.

In the embodiment shown in FIGS. 1, 2 and 4 to 10, the heads are frustoconical and of polygonal cross section or comprise a truncated cone of polygonal cross section. The small base of the truncated cone makes contact with the body.

Assuming that the nanowires are produced by molecular beam epitaxy, a judicious choice of the conditions of growth of the nanowires allows a widened head, and especially one taking the form of a truncated cone of polygonal cross section, to be obtained.

In the embodiment described with reference to FIGS. 1 and 2, the heads are stacks of a layer 121 of p-type GaN and of a layer 122 of $p^{++}$-type GaN.

The heads may also be produced differently; in particular, in other examples of embodiments, the layer 121 may be made of InGaN and be surmounted by a conformal or widened layer in turn of p-type GaN, itself surmounted by a conformal or widened layer in turn of $p^{++}$-type GaN. The layer 121 is for example frustoconical and of polygonal cross section. One face of the layer 122 forms the receiving end.

The various receiving ends form a discontinuous surface. Specifically, between the various receiving ends, it is possible to connect the surfaces of the receiving ends to produce a continuous surface, in particular a surface without significant discontinuity in its curvature. The connected discontinuous surface may be planar or substantially planar. More generally, this connected discontinuous surface may also be a non-planar ruled surface or a warped surface. Once the membrane has been placed on the receiving ends, the membrane allows an electrical continuity to be ensured over the discontinuous structure of the nanowire device.

Figure 10:
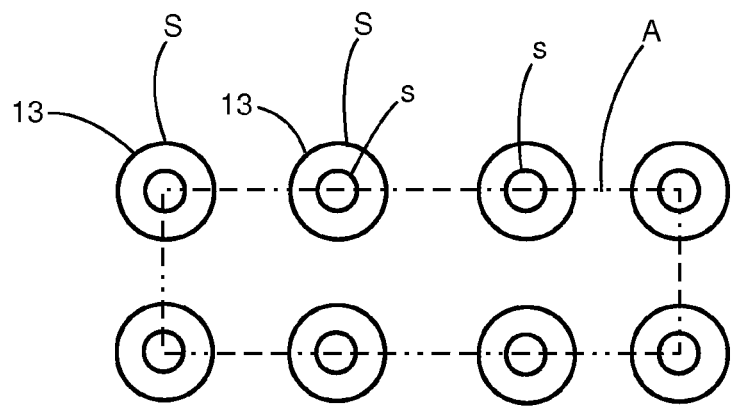
FIG. 10 is a schematic top view of the embodiment of the structure.

Preferably, as shown in FIG. 10, the ratio of the sum of the areas of the surfaces of the receiving ends to the total area of the discontinuous surface connected between the receiving ends is for example higher than 80% or higher than 90% or higher than 95%. Thus, once the membrane has been placed on the ends, the membrane makes contact with the nanowires over more than 80% or more than 90% or more than 95% of its surface. The geometries of the heads therefore define an area density of matter against which the membrane may make contact. This density is very important. The higher it is, the lower the risk that the membrane will be torn or pierced when it is placed on the nanowires and the better the electrical contact between the membrane and the nanowires will be.

If the density of presence of matter at the receiving ends is too low, the membrane may be pierced, especially at the edges of the structure, because of the thinness of the nanowires and/or of the large distance that separates them. Such damage is of course undesirable. To avoid it, the density of presence of matter (expressed in percentage above) must be sufficiently high. To obtain a high density of presence of material at the receiving ends, a nanowire device such as that described above is used. In addition or alternatively, a device having a high area density of nanowires, for example of the order of $10^{10}$ nanowires per $cm^2$ on the surface 21, may be used. The combination of a high density of nanowires and of a nanowire device the nanowires of which are of particular geometry, i.e. are nanowires such as described above, is favorable to the transfer of a membrane without damage or tearing.

Preferably, the ratio of the sum of the areas of the surfaces of the receiving ends to the total area of the discontinuous surface connected between the receiving ends is for example strictly lower than 100%.

The membrane may also be transferred in the case where the nanowires are further apart from one another. For example, the distance between the nanowires, in other words the pitch of the nanowire array, may be larger than or equal to at least five times the transverse dimension of the body of the nanowires. The pitch of the nanowire array will especially be adjusted depending on the mechanical strength of the material forming the membrane.

In another variant embodiment, the heads of the nanowires may not be frustoconical and of polygonal cross section, but may have any other shape. In particular, the heads may be prismatic as shown in FIG. 3. In this case, the diameter of the head 12' is larger than the diameter of the body 11'. Assuming that the nanowires are produced by molecular beam epitaxy, a judicious choice of the conditions of growth of the nanowires allows a widened head, in particular with a geometry of "nail head" shape, to be obtained.

In another variant embodiment, the nanowires may not have a light-emitting-diode structure. Specifically, a nanowire structure such as described above need not be used to emit light. In other applications, the nanowires may especially be produced from a material based on silicon or a material based on any other semiconductor such as those belonging to the arsenide family or based on any other material (metal, polymer, ceramic) on which it is of interest to deposit a membrane allowing the continuity of an electrical injection and/or of the application of a potential to be ensured.

One implementation of a process for producing a structure 100 comprising a membrane 3 forming an electrode, and a plurality of nanowires 1 is described below with reference to FIGS. 4 to 9.

In a first phase, a membrane device 3, 34 comprising the membrane 3 covered with a layer 34 is produced.

In a second phase, a nanowire device 10 such as described above or a nanowire device that differs from what was described above in that the nanowires have a structure such that it is not possible to distinguish a head from a body, i.e. for example a structure the transverse cross section or dimension of which is constant or substantially constant over all the length of the nanowires, is produced or formed. The nanowires of the device 10 form a discontinuous structure. The nanowires are not coalesced, each lying at distance from the others. The ends of the nanowires called ends for receiving the membrane or receiving ends form a discontinuous surface.

In a third phase, the membrane device 3, 34 is placed on the nanowire device 10, especially by transfer. The membrane device is placed directly on the nanowires at the surfaces of the ends for receiving the membrane. The membrane device "bonds" to the surfaces of the receiving ends via the Van der Waals force. Thus, in this process the membrane device is positioned directly on the receiving ends. The membrane device is placed so that the electrically conductive and/or transparent layer of the membrane device makes direct contact with the nanowires, and especially direct contact with the receiving ends of the nanowires. Thus, the membrane device is placed on the nanowires without either of the following having been put in place beforehand:
  a filling material between the various nanowires, or
  a barrier layer on the nanowires, in particular a barrier layer resting on the free ends of the nanowires.

In a fourth phase, the structure is rinsed with a solvent, for example acetone, especially so as to dissolve a layer 34 of the membrane device, and in particular so as to dissolve a resist layer of the membrane device. In this fourth phase, it is then optionally possible to deposit a layer 4 of an electrically conductive second material on the membrane 3, as shown in FIG. 9. The second material may be identical to the first material. This optional depositing step for example allows the membrane to be strengthened mechanically by thickening it.

The first and second phases may be executed in any order. They may also be executed in parallel or simultaneously.

In the first phase, it is possible to implement the following steps.

In a first step, a second substrate 31, for example a silicon wafer, is provided.

Figure 4:
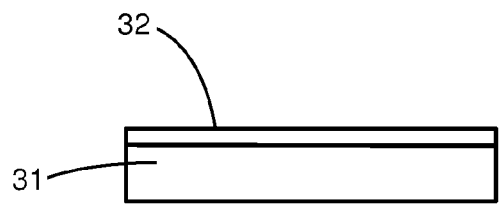
FIGS. 4 to 9 are schematic views illustrating one implementation of a process for producing a nanowire structure.

In a second step, as shown in FIG. 4, a sacrificial layer 32, for example a metal layer, in particular a nickel or copper layer, is deposited on the second substrate.

Figure 5:
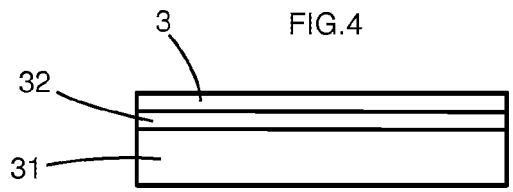

In a third step, as shown in FIG. 5, a layer 3 of the first material, especially for example a layer of about 30 nm thickness or a layer of about 20 nm thickness, is deposited on the sacrificial layer. This layer forms the membrane 3.

Figure 6:
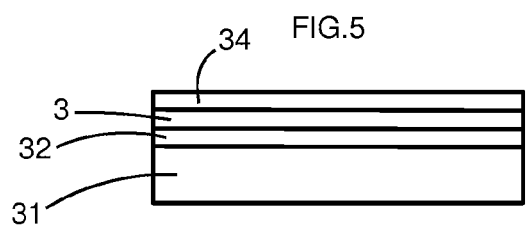

In a fourth step, as shown in FIG. 6, a resist layer 34 is deposited on the layer of first material.

Figure 7:
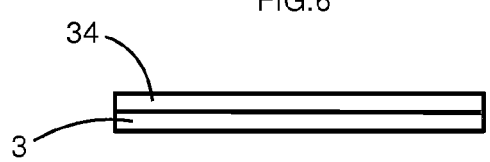
Figure 8:
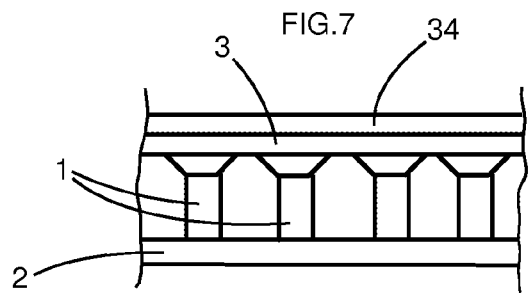

In a fifth step, as shown in FIG. 7, the sacrificial layer 32 is chemically etched, for example with an FeCl$_3$ solution. Thus a membrane (formed from the layers 3 and 34) is obtained, as shown in FIG. 7.

Preferably, in the second phase, the device 10 is formed or produced, for example by molecular beam epitaxy or by metalorganic vapor-phase epitaxy or by etching. A judicious choice of the parameters of the procedure used allows a widened head to be obtained. A judicious choice of the conditions of growth of the nanowires by molecular beam epitaxy especially allows a widened head to be obtained.

By virtue of the device and method described above, it is possible to produce a (transparent and conductive) electrode on micro- or nano-pillars each comprising at the top thereof a planar surface of dimension larger than the diameter of said pillars. Production is completed by placing or transferring a (transparent and conductive) membrane to these top surfaces. The geometry and density of the top surfaces allow an optimized electrical contact to be obtained while preventing potential piercing of the membrane by the pillars. The membrane allows an electrical continuity to be ensured over the discontinuous structure of the nanowire device.

As seen above, one advantageous application of the invention relates to the production of LED structures. It will be noted that in the case of organic LEDs that may be damaged by conventional techniques for depositing metal layers, the solution of transfer is a gentle technique that allows the integrity of a membrane to be preserved during its placement.

It will furthermore be noted that any structure comprising wire-like elements may benefit from the device and method that are the subject of this document, independently of the density or size of the wire-like elements. It is thus especially possible to envision making contact to single photon emitters or to various photonic objects (microdisks).

The use of transferred conductive membranes is in principle not limited to the field of LEDs. It is also possible to transfer this type of membrane to any type of the nanowire or nano-pillar obtained using bottom-up or top-down technology.

The transfer of a membrane made of indium-tin oxide or ITO was described above. However, aside from ITO, any membrane made of another material may in principle be transferred, provided that it can be easily detached from the initial carrier, for example via a chemical etch of a sacrificial layer.

The invention claimed is:

1. A process for producing a nanowire structure, the process comprising:
   forming a nanowire device comprising a plurality of nanowires having a plurality of receiving ends, the receiving ends being formed so as to form planar surfaces,
   placing, by transfer, a membrane device directly on the nanowires at the planar surfaces of the receiving ends to form a membrane comprising a first material that is in contact with the receiving ends.

2. The process as claimed in claim 1, comprising depositing a layer of an electrically conductive second material on the membrane.

3. The process as claimed in claim 1, wherein
   the membrane is transparent and electrically conductive, and/or
   the membrane is intended to form an electrode, and/or
   the nanowires are light-emitting-diode structures.

4. The process as claimed in claim 1, comprising producing the membrane device, comprising:
   providing a second substrate,
   depositing, on the second substrate, a sacrificial layer,
   depositing, on the sacrificial layer, a layer of the first material,
   depositing, on the layer of the first material, a resist layer,
   chemically attacking the sacrificial layer.

5. The process as claimed in claim 1, wherein the forming of the nanowire device is implemented by molecular beam epitaxy or by metalorganic vapor-phase epitaxy or by etching.

6. The process as claimed in claim 1, wherein the forming of the nanowire device comprises forming the nanowire device so that
   the nanowire device comprises a first substrate, the nanowires being placed on the first substrate, and/or
   the nanowires are prismatic or substantially prismatic, and/or
   the nanowires have light-emitting-diode structures.

7. The process as claimed in claim 1, wherein the forming of the nanowire device comprises forming the receiving ends so that the receiving ends form a planar or substantially planar discontinuous surface.

8. The process as claimed in claim 7, wherein the forming of the nanowire device comprises forming the device so that a ratio of a sum of areas of surfaces of the receiving ends to a continuous area of a surface of a membrane designed to make contact with the receiving ends is higher than 80%.

9. The process as claimed in claim 1, wherein the forming of the nanowire device comprises forming nanowires so that
   the nanowires have a geometry that increases in size or flares out in a direction of the receiving ends, and/or
   the nanowires form micro-pillars or nano-pillars including receiving ends, the receiving ends having surfaces having dimensions larger than diameters of the nanowires away from the receiving end.

10. The process as claimed in claim 1, wherein the forming of the nanowire device comprises forming nanowires so that they each comprise a body and a head, the head having a receiving end, a surface of the receiving end having an area 20% larger than an area of a cross section of the body of the nanowire.

11. The process as claimed in claim 10, wherein the forming of the nanowire device comprises forming the bodies of the nanowires into stacks of a layer of n-type GaN, of a layer of InGaN and of a blocking layer.

12. The process as claimed in claim 10, wherein the forming of the nanowire device comprises forming the heads of the nanowires into stacks of a layer of p-type GaN and of a layer of p++-type GaN.

13. The process as claimed in claim 1, wherein the forming of the nanowire device comprises forming the nanowires from silicon-based material.

14. A structure obtained by implementing the production process as claimed in claim 1.

15. The process as claimed in claim 1, wherein the first material is indium-tin oxide.

16. The process as claimed in claim 2, wherein the second material is identical to the first material.

17. The process as claimed in claim 4, wherein
the second substrate is a silicon wafer, and/or
the sacrificial layer is a nickel or copper metal sacrificial layer, and/or
the layer of the first material deposited on the sacrificial layer has a thickness of about 30 nm, and/or
the sacrificial layer is chemically attacked with an $FeCl_3$ solution.

18. The process as claimed in claim 6, wherein the forming of the nanowire device comprises forming the device so that the device comprises a first substrate, the nanowires being placed on the first substrate, and the nanowires are placed perpendicular or substantially perpendicular on a surface of the first substrate.

19. The process as claimed in claim 1,
wherein the membrane device comprises the membrane comprising the first material and a layer on the membrane, and
wherein the process further comprises, after placing the membrane device on the nanowires at the receiving ends, dissolving the layer of the membrane device in order to form the membrane on the receiving ends of the nanowires.

20. The process as claimed in claim 1, comprising placing, by transfer, the membrane device directly on the nanowires without a filling material between the nanowires.

21. The process as claimed in claim 19, wherein the step of dissolving comprises rinsing the nanowire structure with a solvent.

* * * * *